INVENTORS.
CASIMIR J. MYTYCH
THOMAS A. TIETJEN
BY Anthony D. Cennamo
Daniel Rubin
ATTORNEYS INVENTORS.
CASIMIR J. MYTYCH
THOMAS A. TIETJEN
BY Anthony D. Cennamo
Daniel Rubin
ATTORNEYS INVENTORS.
CASIMIR J. MYTYCH
THOMAS A. TIETJEN
BY
Anthony D. Cennamo
Daniel Rubin
ATTORNEYS United States Patent Office 3,334,000

Patented Aug. 1, 1967

3,334,000

METHOD FOR SIMULTANEOUS PRODUCTION OF A PLURALITY OF MICROCIRCUIT WAFERS

Casimir J. Mytych and Thomas A. Tietjen, Rochester, N.Y., assignors to Xerox Corporation, Rochester, N.Y., a corporation of New York Filed Dec. 26, 1963, Ser. No. 333,565

1 Claim. (Cl. 156—11)

ABSTRACT OF THE DISCLOSURE

A method for producing a reusable holder or aligning means for small microcircuit wafers and for simultaneously producing chemical resists on a plurality of the wafers utilizing xerographic techniques.

*Background of the invention*

This invention relates to printed circuits and specifically, to production process and apparatus for fabricating microcircuit elements.

In recent years, a technical revolution has been occuring in electronics. In keeping with the growing need for complexity in electronic circuitry, techniques have been developed so that the fabrication of electronic circuit assemblies increasingly have been automated whereby the laborious hand assembly previously required has been substantially reduced. One technique which has contributed to this recent advance is the development of printed circuits wherein printed conductors or the like on a dielectric substrate connect the various passive circuit elements, thereby largely or completely eliminating the necessity of individual soldered wire connections.

One means to produce these circuits employing xerographic techniques, as disclosed for example in Van Wagner U.S. Patent 2,919,179, is to coat the dielectric with a metallized surface, which in turn is selectively coated in the desired circuit areas with a xerographically formed protective material, commonly called "resist" so that the desired circuit areas are then covered. The unprotected metal areas are then completely removed in a chemical etching bath after which the resist is removed to expose the circuit elements. Baker U.S. Patent 3,061,911, discloses a further process employing xerographic techniques whereby both conducting lines and resistor elements may be formed as integral parts of the printed circuit, thus eliminating the separate handling and soldering of the resistor components in providing a more compact printed circuit. As taught by Baker, a dielectric substrate is clad first with a layer of metallized material having a desired order of resistivity from which to form resistive circuit elements and then with a layer of conductive material. By selectively and successively etching the respective layers, the integral circuit components are formed.

With the growing change from tube circuits to transistor circuits, a new technique known as micro-miniaturization has led to the development of a module system of forming electric assemblies. This system has been pioneered by Diamond Ordnance Fuse Laboratories. In this system, a flat plate or substrate is processed to form the resistors, condensers and conductive lines, while the three-dimensional components, generally as packaged elements such as transistors and diodes, are inserted to form the complete circuit. Fabrication begins usually with a wafer of uniform size comprising, for example, a dielectric forming a substrate which may be ¼" square to 2" by 2" or whatever size is deemed suitable. The metallized circuit components are then assembled or built on in sections by a series or steps on the individual wafer. Complete circuits are then formed by combined individual wafers which may be arranged in parallel held fixed, for example, by means of rigid end plates which may themselves contain sections of circuit components. Three-dimensional elements may then be attached to either the wafers or the end plates.

The prior art, therefore, has made significant advances in printed circuit technology including advances in the technique of micro-miniaturization. However, despite advances in micro-miniaturization, the art has been largely handicapped by the inability to produce these circuit sections on a mass production or large volume basis because of exacting requirements that includes a high degree of accuracy and fidelity in forming the individual circuit components. This becomes particularly acute and increasingly difficult as the wafer members on which the circuits are formed are of dimensions toward the small end of the range. Thus, panel production heretofore has been largely on an individual basis in which the individual panel section is substantially hand processed through the various mechanical and chemical steps in accordance with the requirements. Where the circuit requirements are complex and voluminous, these hand processings have proved too expensive and unsuitable in keeping with production requirements. A high percentage of rejects rendered costs prohibitive.

Accordingly, fabrication of printed circuits, particularly micro-minature circuits, has heretofore been slow, tedious, cumbersome, expensive and inaccurate and not adapted to producing micro-circuits in volume with a high degree of precision. For example, it is conventional in the printed circuit art to use large boards cut to approximate final size from much larger stock such that circuit elements thereon need not be precisely located within the area of the board. After forming the circuit, the board is trimmed to final dimensions. This prior procedure cannot conveniently be applied to microcircuitry when the board may be comprised of a thin wafer ⅜" square or less, and on which, unless the components are precisely located and formed, the utility of the circuit may be destroyed.

*Summary of the invention*

These and other production difficulties are overcome by means of the instant invention, that is advantageously suitable for processing microcircuit panels. By means hereof, there is provided apparatus adapted to process these panels on a high volume basis eliminating the prior difficulties associated with individual handling. By producing panels in accordance with this invention, fabrication costs are so substantially reduced as to make their use practical in devices for which costs of hand made boards were prohibitive. These microcircuit panels therefore produced in accordance with this invention improved such devices in which they are employed as to benefit the public in general through this advance in the art.

Accordingly, it is an object of the invention to provide novel methods for the production of microcircuit panels.

It is a further object of the invention to provide novel process for large volume production of microcircuit panels of 1" square or less.

It is a further object of the invention to provide novel method whereby microcircuit panels can be mass produced with greater reliability than heretofore.

It is a still further object of the invention to provide novel method for high volume fabrication of microcircuit panels with greater reliability more expediently and at lower cost than heretofore.

*Brief description of the drawings*

Other objects and advantages of the present invention will be more readily apparent in view of the following detailed description, especially when read in conjunction with the accompanying drawings, wherein.

*Description of the preferred embodiment*

In a preferred embodiment for carrying out the method hereof, to form chemical resists on the wafers there is employed the process of xerography disclosed for example in Carlson Patent 2,297,691 issued Oct. 6, 1942, in which a xerographic plate comprising a layer of photoconductive insulating material on a conductive backing is given a uniform electric charge over its surface and is then exposed to the subject matter to be reproduced, usually by conventional projection techniques. This exposure discharges the plate areas, in accordance with the radiation intensity that reaches them, and thereby creates an electrostatic latent image on or in the photoconductive layer. Development of the latent image is effected with an electrostatically charged, finely-divided material such as an electroscopic powder that is brought into surface contact with the photoconductive layer and is held thereon electrostatically in a pattern corresponding to the electrostatic latent image. Thereafter, the developed xerographic powder image is usually transferred to a support surface to which it may be fixed by any suitable means. While xerography is to be preferred, as will be understood, the invention is not intended to be limited thereby, since resists can be applied by other known techniques such as silk screening, photo-chemical, or the like.

Figure 1:
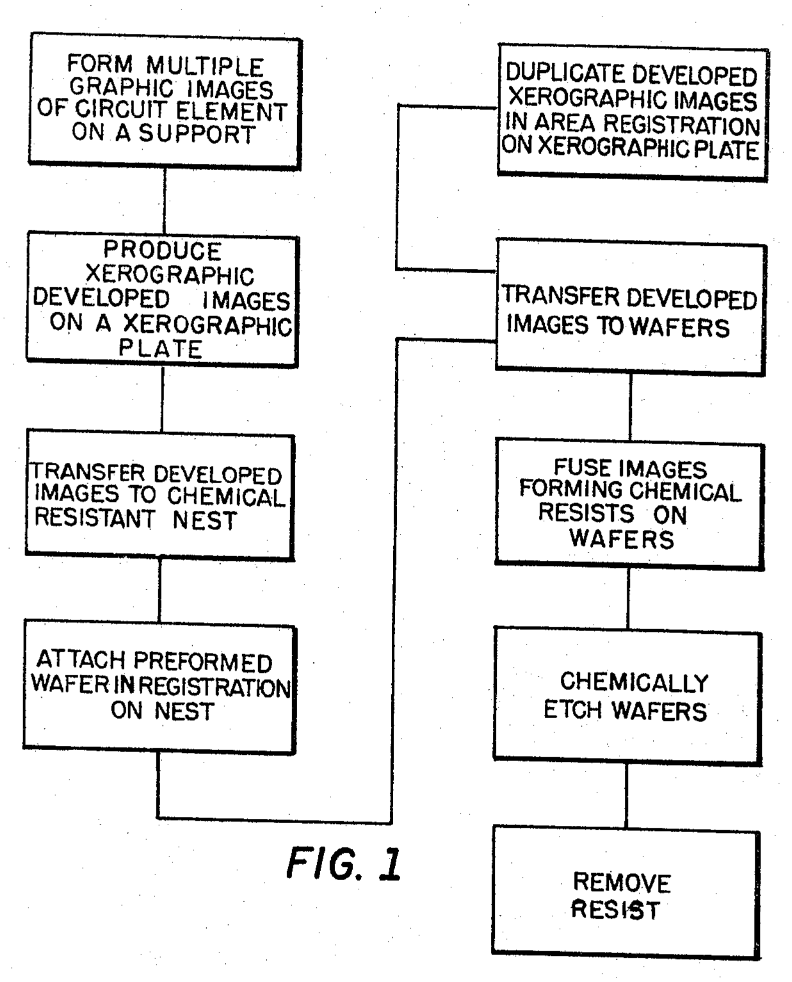
FIG. 1 is a chart diagram arranged to illustrate the sequential steps in accordance with the process hereof.
Figure 2:
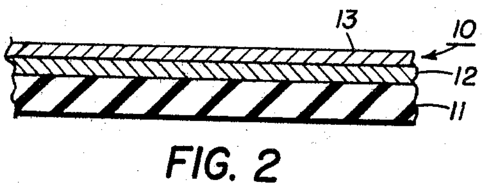
FIG. 2 is a section generally enlarged through a wafer unit of a type which may be processed hereby.

A basic understanding of the process hereof may be had by referring to the descriptive flow diagram of FIG. 1. For detail necessary for a complete understanding of the invention, reference is had to the balance of figures beginning with FIG. 2. In FIG. 2 there is illustrated a type of preformed three-layer wafer 10 which in one utilized embodiment was approximately 0.310″ square and a total of 0.010″ thick for mass processing hereby. The substrate of the wafer designated 11, is preferably a planar member of high dielectric properties and of high mechanical strength as, for example of a phenol-formaldehyde laminate, ceramic material, or the like, and which may be shaped to include tabs, holes, slots or the like adapted for use in its ultimate assembly.

Overlying the substrate is a uniform metallized layer 12 from which one type of electrical circuit components is to be formed. Optionally, there may also be included second overlying metallized layer 13 from which a second type element of the circuit is to be formed. These layers can be uniformly deposited sequentially onto the substrate member as by vacuum evaporation techniques or by chemical techniques known in the art. They may also be deposited selectively in geometric configuration, as for example disclosed in Kinsella and Schwertz copending application Ser. No. 28,642 filed May 12, 1960.

Figures 3, 4, 5, 6:
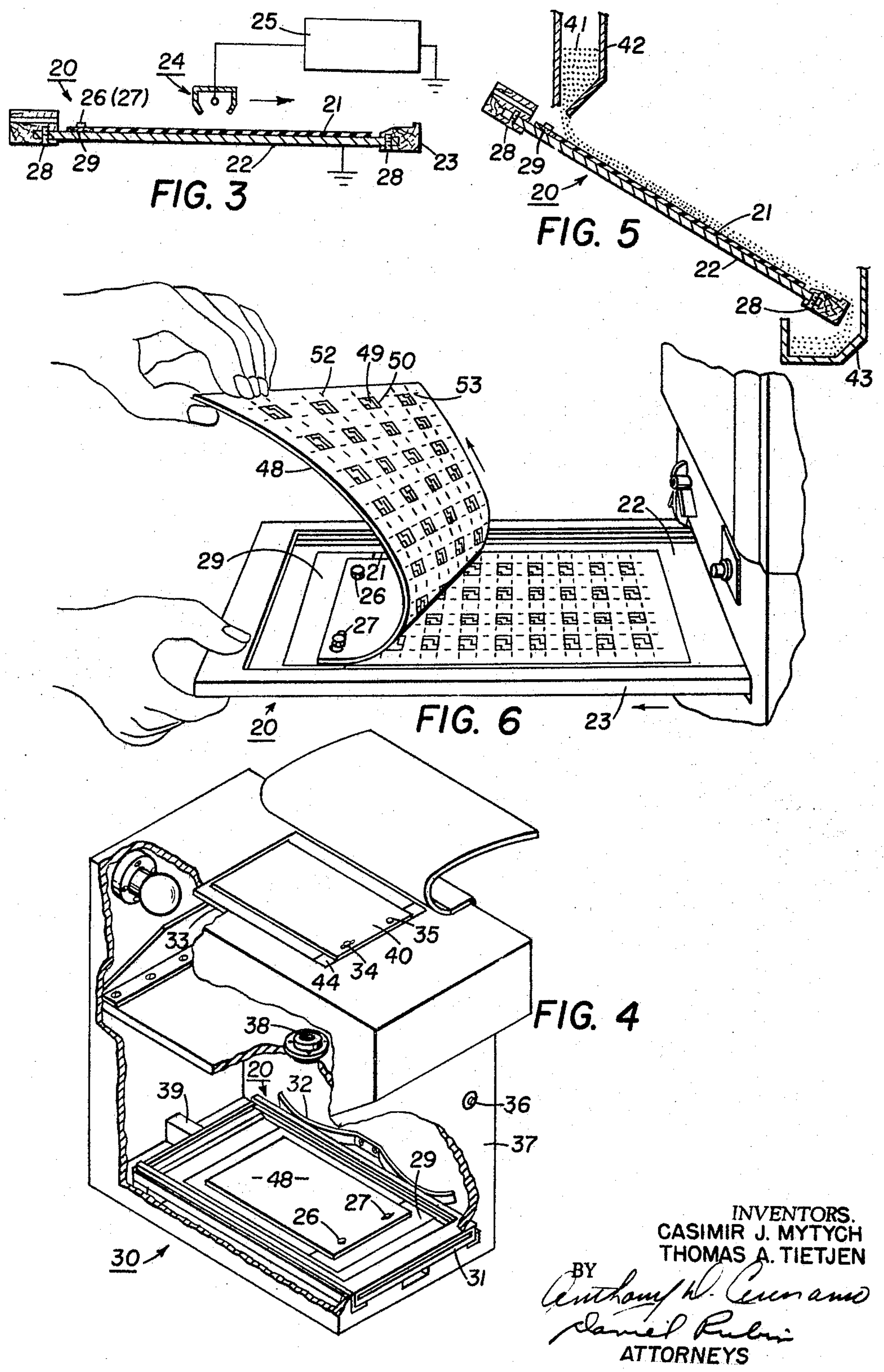
FIG. 3 schematically illustrates charging of a xerographic plate.
FIG. 4 isometrically illustrates exposing a light image of graphic resist patterns to the charged xerographic plate in accordance with an embodiment hereof.
FIG. 5 schematically illustrates development of the latent image on the xerographic plate formed by exposure in FIG. 4.
FIG. 6 isometrically illustrates transferring the developed image to a chemically resistant nest material.

Referring now to FIG. 3, the first step following graphic formation in image multiples as by pencil or ink drawings or the like on a master copy sheet is to apply uniform charge to a xerographic plate designated 20, and comprising a photoconductive insulating layer 21 on a conductive support 22. A conventional form of xerographic plate assembly currently in wide commercial use is disclosed generally in Mayo Patent U.S. 2,619,418 and may comprise a xerographic plate secured via pins 28 to a rectangular plate holding frame 23. The frame is provided with suitable recessed grooves to accommodate a dark slide for shielding the plate from light during its normal use, and to protect the surface of the plate from damage when the plate assembly is stored. Although the xerographic plate may be formed of various compositions and in various sizes, the type most commonly used at present comprises a conductive metallic backing plate having a surface coating of photoconductive material, wherein the exposed surface of the backing plate constitutes an area that is approximately 10½″ wide by 15½″ long, and the photoconductive coating formed thereon covers the entire central area of the plate with exception of a marginal area adjacent the inner edges of the rectangular frame member. The margin area is usually on the order of ¾″ in width and extends completely around the photoconductive area, thereby leaving a usual photoconductive area of approximately 9″ by 14″. It is to be understood that the above-mentioned dimensions are purely illustrative of a conventional type of apparatus and are not to be considered in a limiting sense since it is apparent that such plate assemblies may be made in any desired size and may or may not be provided with the uncoated marginal area. As modified specifically for use herein, the plate includes a transversely extending strip 29 containing two highly precision machined and located registration pins 26 and 27 (see also FIG. 6) for reasons as will be understood.

In conventional xerographic practice, the charging development and transfer steps are usually carried out in an apparatus which is an adaptation of that disclosed in Sabel et al. Patent U.S. 2,600,580. As shown schematically in FIG. 3, charging of the plate is achieved by means of a corona generator 24 energized from a potential source 25 and caused to move at a uniform rate across the plate surface to deposit charge uniformly thereon. Next, subsequent, the plate is removed to a copying device shown in FIG. 4 and designated 30, which may be an adaptation of the xerographic copier disclosed in Mayo et al. Patent U.S. 2,781,704. The copier includes a housing 37 containing a slot opening 31 defined in the front wall to receive the charged xerographic plate and communicating with a defined passage in which to support the photoconductive surface in the focal plane of lens 38. In order to position the plate securely in the slot free of any play that may exist between the side wall of the passage and the plate frame there is provided and end stop 39 and an extended leaf spring 32 secured to the housing and adapted to engage the right frame edge urging the entire plate into the left-most position within the slot provided.

At the object plane along the top wall of the copier, there is a transparent platen 33 adapted to receive the master preformed graphic copy 40 containing the resist or circuit image pattern to be reproduced face down thereon. It should at this stage of the disclosure be appreciated in connection with the embodiment being described, that it is intended that individual wafers may be processed having a total surface area ½ square inch or less. With this size wafer each square inch of area on the copy 40 there can be contained image patterns corresponding to two or more wafer units. Near the front end of the platen 33 as modified hereby and as viewed in FIG. 4, there is provided a transverse wooden strip 44 containing highly machined and placed precision registration pins 34 and 35 adapted to receive holes in the copy sheet 40 prepunched as by means of a precision commercial punch that match the pins and secure the copy in a precise reconstitutable exposure position. It should be noticed here that there exists a fixed superposed relation between copy pins 34 and 35 at the object plane and pins 26 and 27 of the particular xerographic plate 20 at the image plane. Depressing timer button 36 therefore effects a light image exposure of the copy on sheet 40 whereby areas of the plate exposed to illumination dissipates its charge to produce an electrostatic latent image of the copy thereon.

The xerographic plate is then removed from the copier and developed as shown in FIG. 5 whereby an electroscopic powder here designated 41 and which may be of a two-component carrier type developer, as disclosed for example in Walkup Patent 2,618,551, is released from hopper 42 to be cascaded over the plate surface and effect development of the latent image thereon. Excess developer continues across the plate surface to be collected by a collecting bin 43.

Transfer is then effected as shown in FIG. 6 to a support sheet herein termed a "nest" 48 which once formed can be repeatedly reused for subsequent production. The nest comprises a sheet of chemical resistant material insensitive to the chemicals with which the wafers are to be etched and may, for example, comprise material such as Teflon or Cronaflex being Dupont tradenames respectively for tetrofluoroethylene and a polyester. The sheet is prepunched to receive registration pins 26 and 27 as to be placed over the powder image prior to transfer in a precise reconstitutionable relationship thereto. In this position the powder image is transferred from the plate to the nest as by electrostatic transfer techniques utilizing corona generator 24 as is known in the art. In FIG. 6, sheet 48 is shown being removed from the transfer relation with the graphic image reproduction 49 contained in a rectangle 50 corresponding and defining the physical dimensions of the wafer on which the resist image is to be placed.

After fixing the image to the nest, the next step in the process is to superpose the wafer units 10 in corresponding registration to the outlines 50 on the nest member. One method found most convenient to effect this result is to form a matrix by cutting or punching the nest along the outline defined by the rectangle 50. This provides an opening in the nest (see also FIG. 8) by which a tape 51 preferably chemical resistant, such as Teflon, on the backside of the nest sheet can through the openings provided adhesively engage and secure the wafer member physically aligned in registration thereon. Guide lines 52 and 53 reproduced from the original image function to guide the cutting accurately along the outlines 50.

Figure 7:
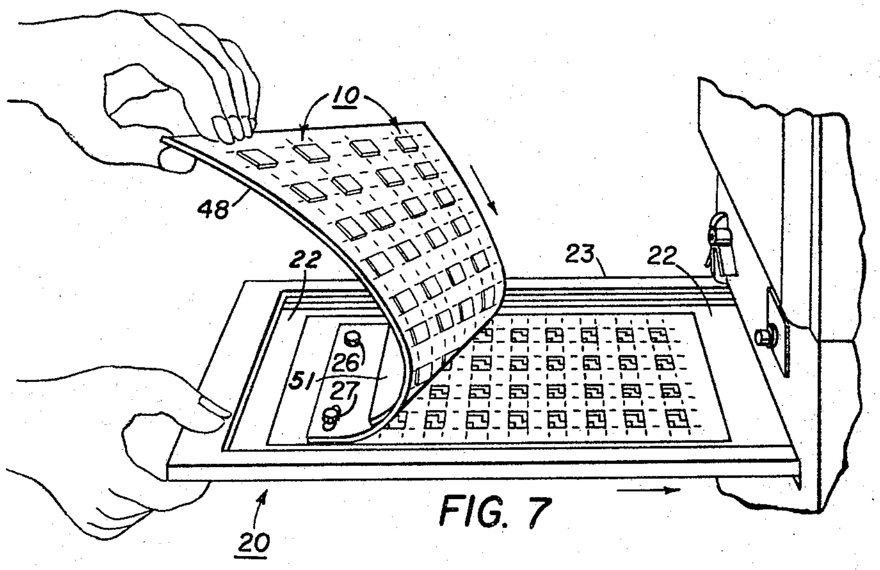
FIG. 7 isometrically illustrates transferring of duplicate developed images from the xerographic plate to a plurality of wafer members secured on the nest support.
Figures 8, 9, 10:
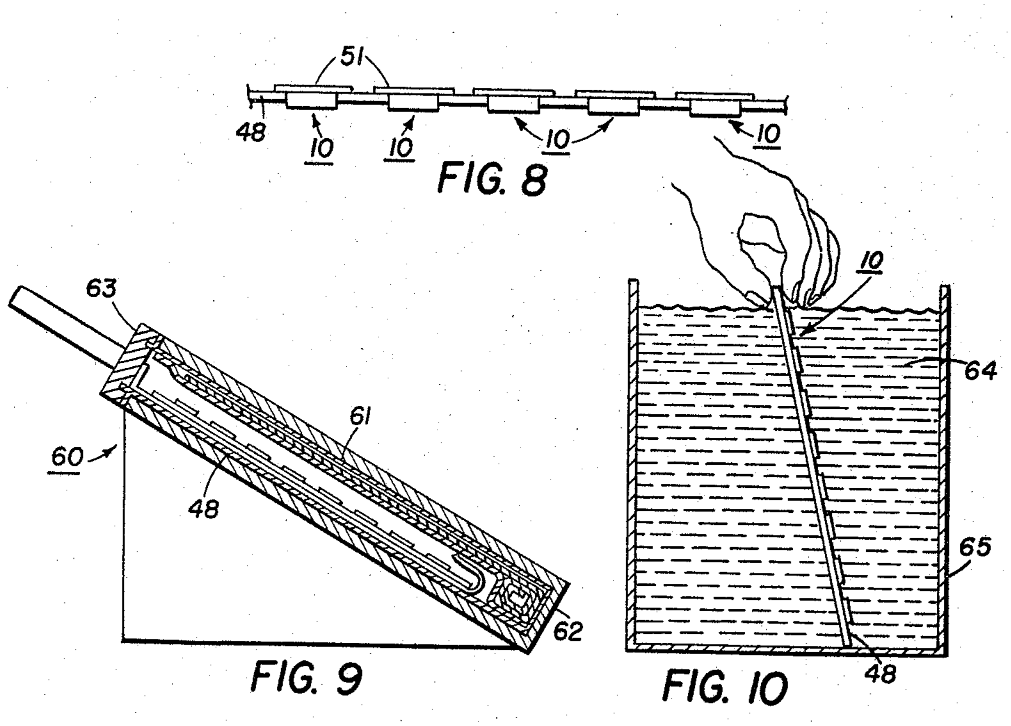
FIG. 8 is a section illustrating support of the wafers to the nest as in FIG. 7.
FIG. 9 sectionally illustrates a fusing mechanism whereby transferred images are affixed to the nest or to the wafer surface.
FIG. 10 illustrates the step of subjecting the wafer members containing resists thereon to a chemical etching bath.

Following transfer, residual images on the xerographic plate are removed as by rubbing with cotton and the xerographic reproduction process is repeated with the same plate in relation to the same copy member 40. Since the same plate member 10 physically realigns in copier 30 in prior registration with the same copy 40 on platen 33, the same xerographic images are thus reproduced on the xerographic plate in precise area registration to those initially formed. After duplicating developed images as aforesaid, the nest member 48 bearing a plurality of the individual wafer members in quantity corresponding to the number of individual image formations, in then placed on the xerographic plate by means of the registration pins in the manner shown in FIG. 7 until supported uniformly overlying developed images in superposed registration therewith. Thereafter, as before, electrostatic transfer effects transfer of the developed image this time to the wafer surfaces to which it is then fixed by subjecting the entire sheet simultaneously as shown in FIG. 9 into a vapor fixing device 60 which may be of a type disclosed in Carlson Patent 2,776,907. In the fusing device, vapor of a solvent is generated by means of a wick member 61 immersed at its lower end in a reservoir of liquid solvent 62 of the solvent soluble component of the powder image. Tray 63 permits the nest member to be inserted into and out of the vapor atmosphere for a predetermined time period to affix the resist images.

After fixing, the entire nest sheet 48 is brought into contact with the etching solution such as by means of a body of acid 64 (FIG. 10) contained in a reservoir 65. Stirring means (not shown) can be provided to maintain a constant circulation of acid into contact with the wafers. On removing the nest, the top layer of component material 13 has been etched away and upon removing the resist material there is exposed the circuit components formed simultaneously on the individual wafer members. Where the wafer members are to have only one component formed thereon as by having a layer 12 supported on substrate 11 without a layer 13, this then, except for removal of the resist, forms the end result. Where there is also to be included a layer 13 overlying layer 12 such that the first circuit component is formed of layer 13, a subsequent resist image is placed on the bared areas of layer 12 to initiate formation of a circuit element thereon and the above steps are repeated. To effect this result with the exacting registration requirement of the instant process, the separate copy sheets 40 comprising the graphic image of the respective resists are formed separately and at least one of the copy sheets comprises a transparency. The two copy sheets are then superimposed by their corresponding rectangles 50 of the graphic image and then simultaneously punched as aforesaid such that when laid on platen 33 registration pins 34 and 35 will separately receive each copy sheet in identical image registration to the xerographic plate below. Hence, after a first circuit element formation on the wafer substrate the xerographic process is repeated without the necessity of forming an intermediate nest member, and the developed xerographic image is transferred directly to the wafer members already contained on the nest. Since pins 26 and 27 of the xerographic plate remain in the same alignment with pins 34 and 35 on the copy platen, the second resist formations transfer to the wafers in precise registration to the circuit elements previously formed.

Variations to the above steps may readily occur to those skilled in the art. One such variation is particularly applicable where the wafers contain metallized coatings on both sides as occurs with chemical dipping techniques. This variation may include the use of a nest formed as above with the cutout rectangles 50 to receive the wafers. The nest thus formed is placed in registration onto pins of the type described above secured in a groundable metal plate of, for example, bare aluminum corresponding in size approximately to that of the xerographic plate from which the reproduction was taken. The wafers are precisely placed in the nest cutouts and a subsequent xerographic redevelopment is formed and transferred to an intermediate transfer sheet prepunched in registration to match the nest. By placing the resist bearing transfer sheet over the nest containing wafers, the resist image can be repelled from the former to the wafers by means of an electrostatic transfer technique while the laminate is grounded as disclosed in Van Wagner Patent U.S. 2,919,179. After fusing the resist to the wafers, they can be removed from the nest and processed for etching in batch as in a basket container or the like. To repeat the process for placing a second resist on the same wafer the same nest can be reused to effect reconstitutable registration.

As a still further variation, a nest is formed of any suitable material, not necessarily chemical resistant, and placed on a pin containing support. Wafers are placed precisely in the cutouts after which a chemical resistant nest in registration and having cutouts which need correspond only to the vicinity of wafers on the first nest is placed thereover. By means of a tape applied through the holes in the second nest, the wafers become secured thereto and are thereafter processed similarly as in the first described embodiment.

By the above description, there is disclosed novel process for fabricating miniature microcircuits susceptible to high volume production thereof. By means of a wafer supporting reusable chemical resistant nest member, a large number of individual wafers can be simultaneously processed for forming a circuit element individually on the wafer members. By this means, there is overcome the basic difficulties in the prior art in that the individual wafer sections which by virtue of their sizes are most difficult to handle can be processed in large volumes without complex handling equipment that would normally be required. Obviously, however, etching steps illustrated in FIG. 10 could be readily automated to free an operator and further expedite the process. Since registration between exposure and a xerographic plate comprises an important feature necessary in carrying out the steps of the invention, any number of individual circuit elements can be formed sequentially on the individual wafer members limited as to quantity only by the physical capacity of the equipment. Also, defects in the resists such as pin holes, which have been found to occur inadvertently by prior techniques and which necessarily have an adverse effect on the ultimately formed circuit component can be easily overcome by the method hereof. If, on casual inspection by the operator, pin holes or other imperfections are noticed in the transferred resist image, a subsequent resist can readily be superimposed on the first resist by virtue of the high accuracy of registration afforded by the registration pins in the xerographic plate and on the exposure platen.

Since many changes can be made in the above construction, and many apparently widely different embodiments of this invention could be made without departing from the scope thereof, it is intended that all matter contained in the drawings and specification shall be interpreted illustrative and not in a limiting sense.

What is claimed is:

A method for simultaneously producing microcircuits on a plurality of wafer panels comprising the steps of:

(a) forming a multiplicity of transferrable xerographic powder images on a xerographic plate from a graphic original of similar circuit components optically exposed to said plate when secured in precise reconstitutable optical alignment therewith;

(b) transferring the powder images substantially simultaneously to a nest forming sheet while said nest sheet is supported in precise reconstitutable transfer alignment with said xerographic plate;

(c) producing cutouts in said nest sheet about the outlines of said transferred images;

(d) mounting one micro circuit wafer panel in each cutout of said nest;

(e) forming a second multiplicity of transferrable xerographic powder images reproduced from said graphic original on said same xerographic plate in overlying registration in the areas thereof in which the first powder images were contained;

(f) transferring the second powder images from the xerographic plate to a transfer sheet while the latter is in reconstitutable alignment therewith;

(g) aligning said transfer sheet in registration overlying the wafer panels in said nest;

(h) electrostratically transferring the powder images from said transfer sheet to the wafer panels while in said last recited relation;

(i) fusing the powder images to the wafer panels to constitute a chemical resist thereon; and (j) subjecting the wafer panels to an etching solution of the wafer layers on which the resists are contained.

References Cited

UNITED STATES PATENTS

| | | | |
|---|---|---|---|
| 2,919,179 | 12/1959 | Van Wagner | 156—10 |
| 3,060,020 | 10/1962 | Grieg | 96—1 |
| 3,218,163 | 11/1965 | Acton et al. | 96—1 |
| 3,219,509 | 11/1965 | Kinsella | 156—3 X |

OTHER REFERENCES

The Uses of Photo Processes in the Manufacture of Micro Miniature Circuits, H. G. Manfield, Electronic Engineering, August 1963, pp. 520 to 524, copy in Library or 96—35 PC.

JACOB H. STEINBERG, *Primary Examiner.*